(12) United States Patent
Lee et al.

(10) Patent No.: US 7,760,038 B2
(45) Date of Patent: Jul. 20, 2010

(54) VOLTAGE CONTROLLED OSCILLATOR CAPABLE OF TUNING NEGATIVE RESISTANCE

(75) Inventors: Yong-Deuk Lee, Daejeon (KR);
Cheol-Oh Jeong, Gyeonggi-do (KR);
Jong-Won Eun, Daejeon (KR);
Seong-Pal Lee, Daejeon (KR); Ho-Jin Lee, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 92 days.

(21) Appl. No.: 12/096,062

(22) PCT Filed: Dec. 7, 2005

(86) PCT No.: PCT/KR2005/004178

§ 371 (c)(1),
(2), (4) Date: Jun. 4, 2008

(87) PCT Pub. No.: WO2007/102628

PCT Pub. Date: Sep. 13, 2007

(65) Prior Publication Data

US 2008/0309419 A1    Dec. 18, 2008

(51) Int. Cl.
*H03B 5/00* (2006.01)
*H03B 5/18* (2006.01)

(52) U.S. Cl. ............... 331/117 FE; 331/96; 331/117 D; 331/177 V

(58) Field of Classification Search ........... 331/96–102, 331/117 R, 117 FE, 117 D, 177 V
See application file for complete search history.

(56) References Cited

U.S. PATENT DOCUMENTS

| 4,754,236 A | * | 6/1988 | Mamodaly et al. ..... 331/117 FE |
| 4,868,526 A | * | 9/1989 | Camiade et al. ........ 331/117 FE |
| 4,906,946 A | | 3/1990 | Mekata et al. |

(Continued)

FOREIGN PATENT DOCUMENTS

JP          10-093348         4/1998

(Continued)

OTHER PUBLICATIONS

Yun Hi Lee, et al; "The Frequency tuning of the dielectric resonator oscillator using a varactor diode," (Fall Conference of Korea Information and Communications Society, vol. 10, No. 1, pp. 227, May 1991), pp. 227-229.

(Continued)

*Primary Examiner*—David Mis
(74) *Attorney, Agent, or Firm*—Ladas & Parry LLP

(57) ABSTRACT

Provided is a voltage controlled oscillator having a new type of a resonator and a negative resistance part capable of finely tuning negative resistance. Thus, the voltage controlled oscillator has an excellent quality factor characteristic and can finely tune the negative resistance even after its fabrication is completed. The voltage controlled oscillator having an active element includes: a resonating unit for generating an oscillation frequency according to a resonance capacitance; a frequency tuning unit, connected to a source terminal of the active element, for tuning the oscillation frequency; and a negative resistance adjusting unit, connected to the frequency tuning unit, for generating a negative resistance to adjust the oscillation frequency, the negative resistance adjusting unit including a varactor diode for finely adjusting the negative resistance.

3 Claims, 3 Drawing Sheets

U.S. PATENT DOCUMENTS

| | | | |
|---|---|---|---|
| 5,122,765 A | * | 6/1992 | Pataut .................. 332/105 |
| 5,550,520 A | | 8/1996 | Kobayashi |
| 6,714,089 B2 | | 3/2004 | Ammar et al. |

FOREIGN PATENT DOCUMENTS

| | | |
|---|---|---|
| JP | 2004-354405 A | 12/2004 |
| JP | 2005-259737 A | 9/2005 |
| KR | 1020010105082 | 11/2001 |
| KR | 1020040000930 A | 1/2004 |

OTHER PUBLICATIONS

Kwang II Chun, et al; "The Design of New Low Phase Noise Dielectric Resonator Parellel Feedback Oscillator," (Paper of Korea Information and Communications, vol. 24, No. 7.A, pp. 947, Jul. 1999), pp. 947-950.

Joosung Lee, et al; "A Design of an Oscillator using simple stub-matching," (Conference of Korea Information and Communications Society, vol. 17, No. 3, pp. 811-814, 1998).

International Search Report mailed Sep. 6, 2006; PCT/KR2005/004178.

* cited by examiner

[Fig. 1]
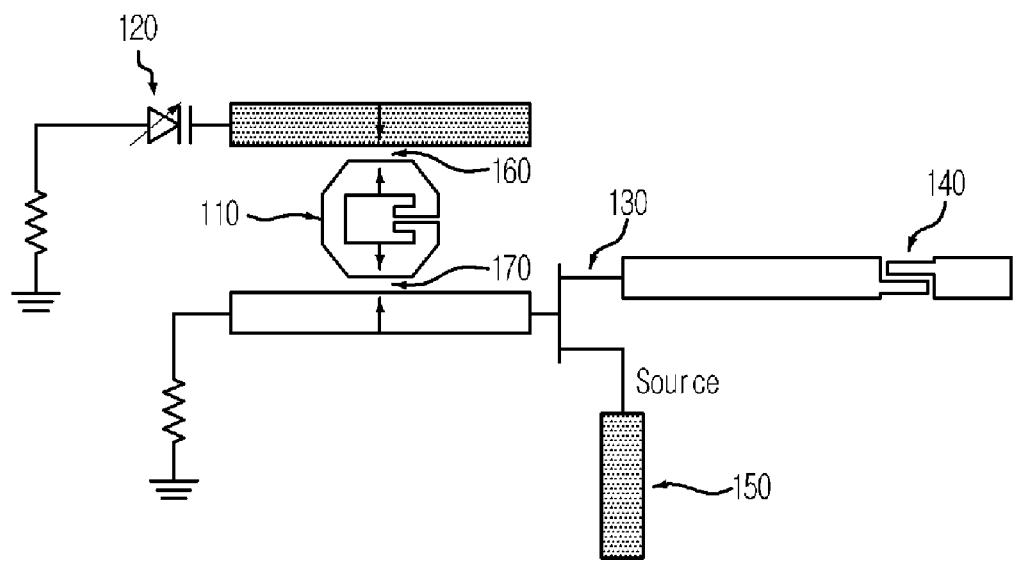
[Fig. 2]
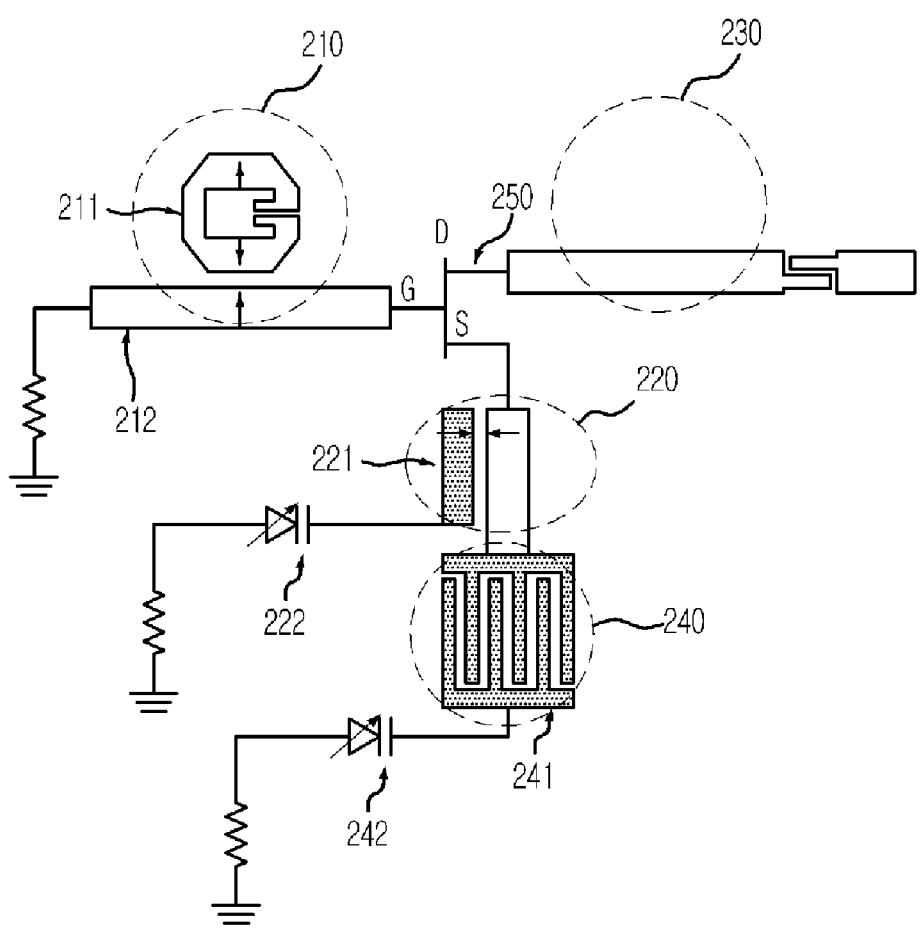

[Fig. 3]
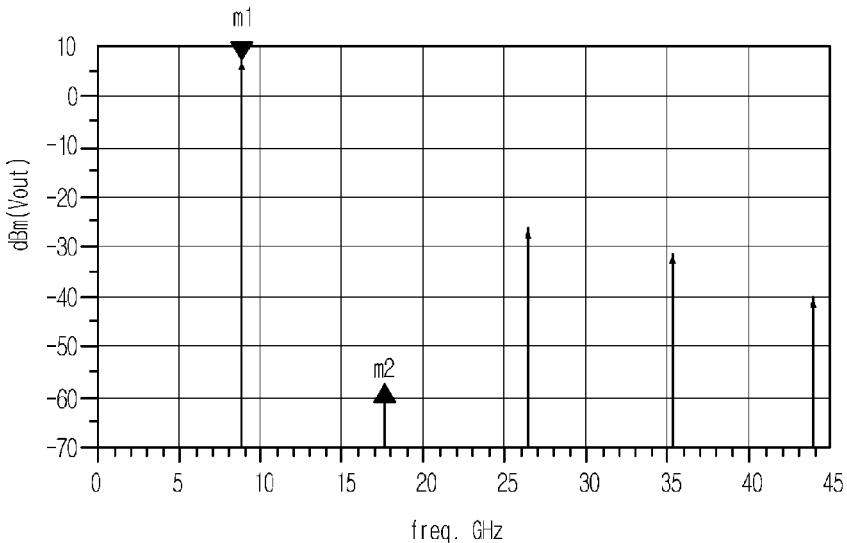
[Fig. 4]
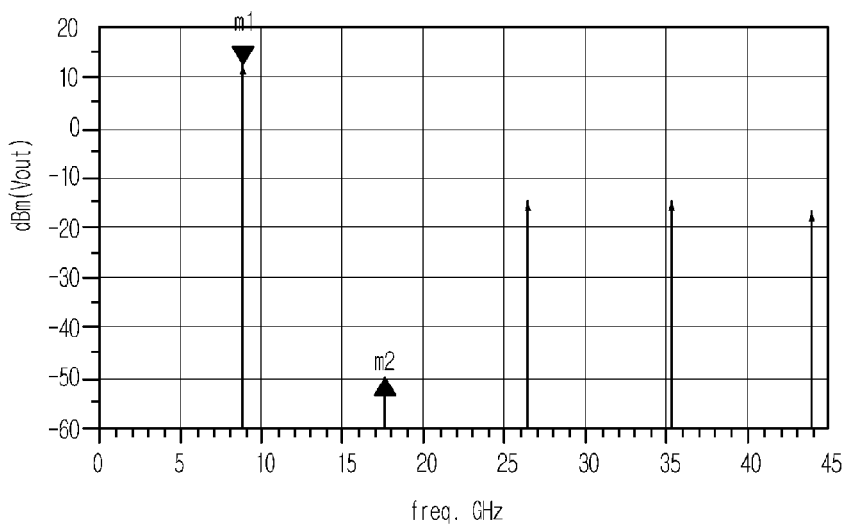
[Fig. 5]
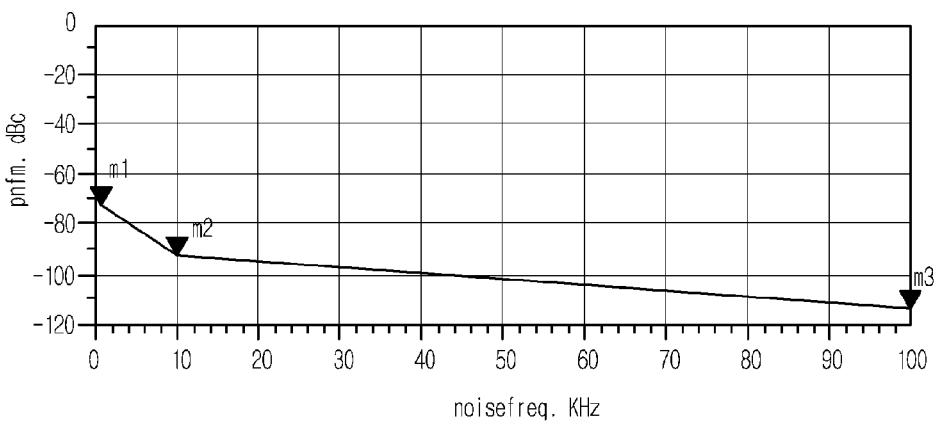

[Fig. 6]
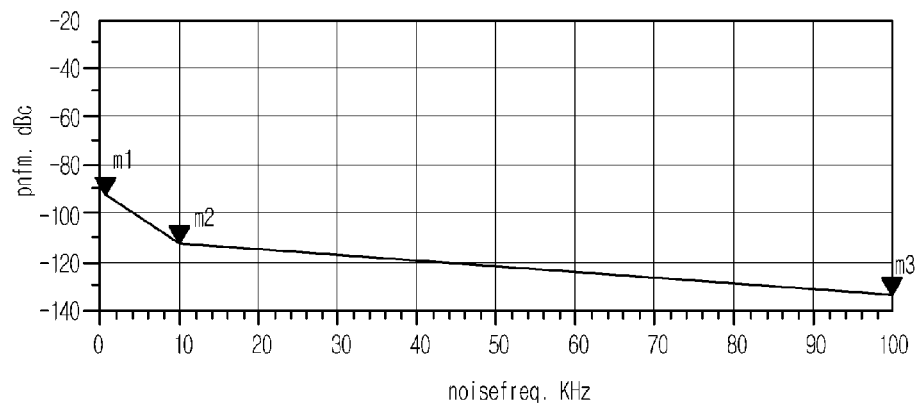
[Fig. 7]
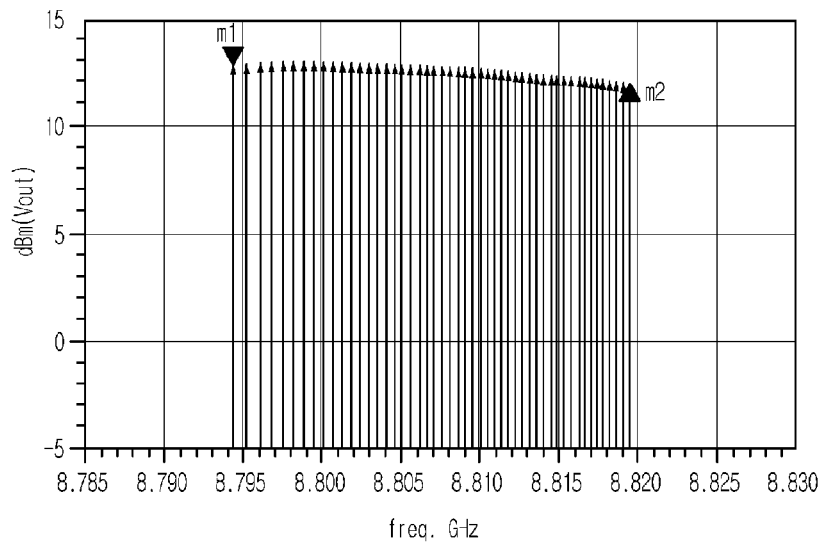
[Fig. 8]
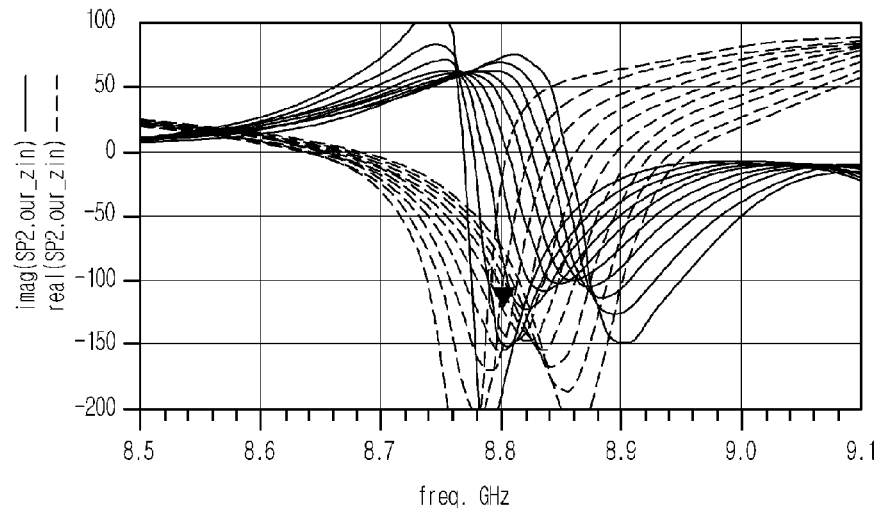

VOLTAGE CONTROLLED OSCILLATOR CAPABLE OF TUNING NEGATIVE RESISTANCE

TECHNICAL FIELD

The present invention relates to a voltage controlled oscillator; and, more particularly, to a voltage controlled oscillator having a new type of a resonator and a negative resistance part capable of tuning negative resistance.

BACKGROUND ART

Voltage controlled oscillator (VCO) converts an external voltage into a desired oscillation frequency. The VCO has a great influence on the efficiency and stability in modulation/demodulation of RF signals.

Generally, the VCO uses a dielectric resonator, which has a good stability, is less influenced by temperature change, and has a high quality factor. In recent years, as RF components are required to be small-sized, lightweight and economic, a planar resonator suitable for Monolithic Microwave Integrated Circuit (MMIC) such as Hair-Pin resonator is widely used.

FIG. 1 is a circuit diagram of a conventional VCO. In the VCO of FIG. 1, a varactor diode is added to a single oscillator in parallel.

Referring to FIG. 1, the conventional VCO includes a resonator 110 having upper and lower portions connected to transmission lines, a varactor diode 120 for converting a frequency in the resonator 110, an active element 130, a band pass filter 140 for DC shielding, and an open stub 150 for generating a negative resistance.

The resonator 110 has a band pass filter characteristic, and coupling gaps 160 and 170 exist in the upper and lower portions of the resonator 110. The conventional VCO of FIG. 1 changes the oscillation frequency by adjusting the length between the resonator 110 and the active element 130 and the length of the open stub 150.

In the VCO widely used in RF/microwave band, the open stub 150 is connected to a source terminal of the active element 130 in order to generate the negative resistance. To control the negative resistance, a pad is added around the open stub 150, or the length of the open stub 150 is adjusted little by little.

The conventional VCO has a poor quality factor characteristic and generate great error in adjusting the negative resistance. Further, the MMIC resonator cannot adjust the negative resistance after its fabrication is completed.

DISCLOSURE

Technical Problem

It is, therefore, an object of the present invention to provide a VCO having a new type of a resonator and a negative resistance part capable of finely tuning negative resistance. Thus, the VCO has an excellent quality factor characteristic and can finely tune the negative resistance even after its fabrication is completed.

Technical Solution

In accordance with one aspect of the present invention, there is provided a VCO having an active element, including: a resonating unit for generating an oscillation frequency according to a resonance capacitance; a frequency tuning unit, connected to a source terminal of the active element, for tuning the oscillation frequency; and a negative resistance adjusting unit, connected to the frequency tuning unit, for generating a negative resistance to adjust the oscillation frequency, the negative resistance adjusting unit including a varactor diode for finely adjusting the negative resistance.

Advantageous Effects

In accordance with the present invention, the negative resistance can be finely tuned through the connection of the interdigital capacitance and the varactor. Thus, the oscillation frequency can be changed without degrading the quality factor. Therefore, the VCO of the present invention can physically adjust the oscillation frequency even after it is manufactured in MMIC.

Further, the frequency tuning according to a bias voltage can be easily achieved by connecting a coupling line and a varactor diode to a source terminal of an active element.

DESCRIPTION OF DRAWINGS

The above and other objects and features of the present invention will become apparent from the following description of the preferred embodiments given in conjunction with the accompanying drawings, in which:

FIG. 1 is a circuit diagram of a conventional VCO;

FIG. 2 is a circuit diagram of a VCO in accordance with an embodiment of the present invention;

FIG. 3 is a graph illustrating an output spectrum of the conventional VCO of FIG. 1;

FIG. 4 is a graph illustrating an output spectrum of the VCO of FIG. 2;

FIG. 5 is a graph illustrating a phase noise characteristic of the conventional VCO of FIG. 1;

FIG. 6 is a graph illustrating a phase noise characteristic of the VCO of FIG. 2;

FIG. 7 is a graph illustrating a resonance spectrum of the VCO of FIG. 2; and

FIG. 8 is a graph illustrating a variation of a negative resistance in the VCO of FIG. 2.

BEST MODE FOR THE INVENTION

Other objects and aspects of the invention will become apparent from the following description of the embodiments with reference to the accompanying drawings, which is set forth hereinafter.

FIG. 2 is a circuit diagram of a VCO in accordance with an embodiment of the present invention. In the VCO of FIG. 2, a frequency tuning unit and a negative resistance adjusting unit are added to a single resonator.

Referring to FIG. 2, the VCO in accordance with the present invention includes a resonating unit 210, a frequency tuning unit 220, an output matching unit 230, and a negative resistance adjusting unit 240.

The resonating unit 210 is connected to a gate terminal of the active element 250 and generates an oscillation frequency according to a resonance capacitance. The frequency tuning unit 220 is connected to a source terminal of the active element 250 and tunes the oscillation frequency. The negative resistance adjusting unit 240 is connected to the frequency tuning unit 220 and adjusts the oscillation frequency. The output matching unit 230 is connected to a drain terminal of the active element 250 and band-pass-filters the oscillation frequency and removes DC component, thereby outputting the oscillation frequency. In this embodiment, an HEMT device is used as the active element 250.

More specifically, the gate terminal of the active element 250 is connected to a transmission line 212 coupled to a resonator 211, and the transmission line 212 is terminated with a 50-Ω resistor in order to suppress parasitic oscillation and hysteresis. In addition, a gate bias has a self bias form.

At this point, the resonator 211 is a band stop filter and has to sufficiently reflect a desired frequency to the transmission line 212. Reflection loss and reflection selectivity of the band stop filter influence the energy transmitted to a load and a phase noise characteristic, and has a direct relation to the quality factor of the resonator 211. Accordingly, in a linear design of the VCO and a nonlinear design to predict the output and phase noise, a Hair-Pin resonator has to be correctly implemented. In this embodiment, the resonator 211 is small-sized and has a good quality factor compared with a general Hair-Pin resonator.

The quality factor of the resonator 211 is optimized by optimizing the coupling gap between the resonator 211 and the transmission line 212. The frequency tuning unit 220 connected to the source terminal of the active element 250 includes a 50-Ω coupling transmission line 221 and a varactor diode 222, which are configured to minimize the degradation of the quality factor.

Meanwhile, the negative resistance adjusting unit 240 includes an interdigital capacitance 241 to generate the negative resistance, and the interdigital capacitance 241 is connected to the varactor diode 242 for finely adjusting the negative resistance. At this point, the electrical length of the source terminal of the active element 250 is varied according to the change in the capacitance of the varactor diode 242 and the change in the length between the resonator 211 and the active element 250. Thus, the negative resistance is changed. Therefore, when an initial oscillation condition is satisfied, the VCO reaches a normal oscillation.

In addition, the output matching unit 230 includes a microstrip line that shields DC component and acts as a band pass filter.

Hereinafter, results obtained when the VCOs of FIGS. 1 and 2 are simulated using ADS 2003, which is an RF circuit design tool (CAD tool), will be described.

FIG. 3 is a graph illustrating an output spectrum of the conventional VCO of FIG. 1, and FIG. 4 is a graph illustrating an output spectrum of the VCO of FIG. 2.

As illustrated in FIG. 3, the conventional VCO has a difference of about −65 dBc between a basic frequency component (m1) and a second harmonic component (m2). On the other hand, as illustrated in FIG. 4, the VCO of the present invention has a difference of about −62 dBc between a basic frequency component (m1) and a second harmonic component (m2).

FIG. 5 is a graph illustrating a phase noise characteristic of the conventional VCO of FIG. 1, and FIG. 6 is a graph illustrating a phase noise characteristic of the VCO of FIG. 2.

As illustrated in FIG. 5, the conventional VCO has a phase noise characteristic of −73.39 dBc at an offset of 1 kHz, −93.39 dBc at an offset of 10 kHz, and −73.39 dBc at an offset of 100 kHz. On the other hand, as illustrated in FIG. 6, the VCO of the present invention has a phase noise characteristic of −91.84 dBc at an offset of 1 kHz, −111.8 dBc at an offset of 10 kHz, and −131.8 dBc at an offset of 100 kHz. Therefore, the VCO of the present invention exhibits more excellent characteristic than the conventional VCO.

FIG. 7 is a graph illustrating a resonance spectrum of the VCO of FIG. 2.

As illustrated in FIG. 7, the VCO of the present invention has a flatness of ±0.4 at a tuning bandwidth of 25 MHz centering on 8.8 GHz. That is, the tuning frequency generated from the frequency tuning unit 220 of FIG. 2 has excellent flatness.

FIG. 8 is a graph illustrating a variation of a negative resistance in the VCO of FIG. 2.

As illustrated in FIG. 8, in the VCO of FIG. 2, the electrical length of the source terminal is changed according to the variation of the capacitance of the varactor 242, so that the negative resistance is changed. In FIG. 8, a portion ml represents the variation of the negative resistance.

While the present invention has been described with respect to certain preferred embodiments, it will be apparent to those skilled in the art that various changes and modifications may be made without departing from the scope of the invention as defined in the following claims.

What is claimed is:

1. A voltage controlled oscillator having an active element, comprising:
   a resonating unit for generating an oscillation frequency according to a resonance capacitance;
   a frequency tuning unit, connected to a source terminal of the active element, for tuning the oscillation frequency; and
   a negative resistance adjusting unit, connected to the frequency tuning unit, for generating a negative resistance to adjust the oscillation frequency, the negative resistance adjusting unit including a varactor diode for finely adjusting the negative resistance,
   wherein the frequency tuning unit includes a coupling line and a varactor diode so as to minimize the degradation of quality factor, and
   wherein the negative resistance adjusting unit includes an interdigital capacitance and a varactor diode and adjusts the negative resistance by varying an electrical length of the source terminal according to capacitance of the varactor diode.

2. The voltage controlled oscillator as recited in claim 1, further comprising an output matching unit for band-pass-filtering the oscillation frequency component and removing DC component, thereby outputting a desired oscillation frequency.

3. The voltage controlled oscillator as recited in claim 1, wherein the resonating unit is one of a coaxial resonator, a Hair-Pin resonator, and a dielectric resonator.

* * * * *